(12) United States Patent
Kobayashi

(10) Patent No.: US 9,318,565 B2
(45) Date of Patent: Apr. 19, 2016

(54) POWER SEMICONDUCTOR DEVICE WITH DUAL FIELD PLATE ARRANGEMENT AND METHOD OF MAKING

(71) Applicant: KABUSHIKI KAISHA TOSHIBA, Tokyo (JP)

(72) Inventor: Hitoshi Kobayashi, Hakusan Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/474,051

(22) Filed: Aug. 29, 2014

(65) Prior Publication Data

US 2015/0263107 A1  Sep. 17, 2015

(30) Foreign Application Priority Data

Mar. 14, 2014 (JP) ................................. 2014-052181

(51) Int. Cl.

| H01L 29/40 | (2006.01) |
|---|---|
| H01L 27/088 | (2006.01) |
| H01L 21/8234 | (2006.01) |
| H01L 21/3213 | (2006.01) |
| H01L 29/417 | (2006.01) |
| H01L 29/80 | (2006.01) |
| H01L 29/49 | (2006.01) |
| H01L 29/778 | (2006.01) |
| H01L 29/20 | (2006.01) |

(52) U.S. Cl.
CPC ........ *H01L 29/404* (2013.01); *H01L 21/32133* (2013.01); *H01L 21/823437* (2013.01); *H01L 21/823475* (2013.01); *H01L 27/088* (2013.01); *H01L 29/41758* (2013.01); *H01L 29/802* (2013.01); *H01L 29/2003* (2013.01); *H01L 29/402* (2013.01); *H01L 29/4916* (2013.01); *H01L 29/7787* (2013.01)

(58) Field of Classification Search
CPC ............ H01L 29/404; H01L 29/66431; H01L 29/4916; H01L 29/66462; H01L 29/66522; H01L 29/7786; H01L 27/088; H01L 21/32133
See application file for complete search history.

(56) References Cited

U.S. PATENT DOCUMENTS

| 6,198,122 B1 * | 3/2001 | Habu et al. ..................... 257/296 |
|---|---|---|
| 7,573,078 B2 * | 8/2009 | Wu et al. ........................ 257/194 |
| 7,928,475 B2 * | 4/2011 | Parikh et al. .................. 257/194 |

(Continued)

FOREIGN PATENT DOCUMENTS

JP   2011-192834   9/2011

*Primary Examiner* — Matthew Landau
*Assistant Examiner* — Grant Withers
(74) *Attorney, Agent, or Firm* — Patterson & Sheridan, LLP

(57) ABSTRACT

A semiconductor device includes a semiconductor layer, gate electrodes, an insulating film, source electrodes, and drain electrodes which are provided on the semiconductor layer. Each of the source electrodes and the drain electrodes are spaced in the insulating film from a corresponding gate electrode, such that one end thereof is in contact with the semiconductor layer and the other end thereof is exposed. Further, the semiconductor device includes first field plate electrodes, each of which is provided on a corresponding gate electrode and the insulating film, and second field plate electrodes, each of which is provided on the insulating film between a corresponding first field plate electrode and a corresponding drain electrode. Furthermore, the thickness of the insulating film between each first field plate electrode and the semiconductor layer is smaller than the thickness of the insulating film between each second field plate electrode and the semiconductor layer.

7 Claims, 6 Drawing Sheets

(56) References Cited

U.S. PATENT DOCUMENTS

| | | | |
|---|---|---|---|
| 8,581,301 B2* | 11/2013 | Saito et al. | 257/195 |
| 8,592,865 B1* | 11/2013 | Hughes | 257/192 |
| 2002/0005528 A1* | 1/2002 | Nagahara | 257/189 |
| 2005/0062069 A1* | 3/2005 | Saito et al. | 257/213 |
| 2005/0110042 A1* | 5/2005 | Saito et al. | 257/192 |
| 2005/0189559 A1* | 9/2005 | Saito et al. | 257/189 |
| 2006/0011915 A1* | 1/2006 | Saito et al. | 257/65 |
| 2006/0202272 A1* | 9/2006 | Wu et al. | 257/355 |
| 2007/0051977 A1* | 3/2007 | Saito et al. | 257/192 |
| 2007/0200143 A1* | 8/2007 | Saito et al. | 257/192 |
| 2007/0249119 A1* | 10/2007 | Saito | 438/253 |
| 2008/0203433 A1* | 8/2008 | Sato | 257/192 |
| 2008/0277692 A1* | 11/2008 | Saito et al. | 257/192 |
| 2009/0008679 A1* | 1/2009 | Saito | 257/199 |
| 2009/0230429 A1* | 9/2009 | Miyamoto et al. | 257/192 |
| 2010/0219451 A1* | 9/2010 | Chow et al. | 257/192 |
| 2010/0219455 A1* | 9/2010 | Niiyama et al. | 257/288 |
| 2010/0230717 A1* | 9/2010 | Saito | 257/140 |
| 2010/0244097 A1* | 9/2010 | Niiyama et al. | 257/192 |
| 2010/0314666 A1* | 12/2010 | Saito et al. | 257/201 |
| 2012/0018735 A1* | 1/2012 | Ishii | 257/76 |
| 2012/0187451 A1* | 7/2012 | Saito | 257/192 |
| 2012/0205667 A1* | 8/2012 | Simin et al. | 257/77 |
| 2013/0056753 A1* | 3/2013 | Simin et al. | 257/77 |
| 2013/0228788 A1* | 9/2013 | Yamamura | 257/76 |
| 2013/0240899 A1* | 9/2013 | Yoshioka et al. | 257/76 |
| 2013/0277680 A1* | 10/2013 | Green et al. | 257/76 |
| 2013/0306980 A1* | 11/2013 | Niiyama et al. | 257/76 |
| 2014/0061659 A1* | 3/2014 | Teplik et al. | 257/76 |
| 2014/0092638 A1* | 4/2014 | Nishimori et al. | 363/17 |
| 2014/0097449 A1* | 4/2014 | Takada | 257/77 |
| 2014/0120703 A1* | 5/2014 | Iwami | 438/478 |
| 2014/0159050 A1* | 6/2014 | Yoon et al. | 257/76 |
| 2014/0353720 A1* | 12/2014 | Inoue et al. | 257/192 |
| 2015/0021666 A1* | 1/2015 | Chen et al. | 257/194 |
| 2015/0034972 A1* | 2/2015 | Kuraguchi | 257/77 |
| 2015/0137135 A1* | 5/2015 | Green et al. | 257/76 |

* cited by examiner

POWER SEMICONDUCTOR DEVICE WITH DUAL FIELD PLATE ARRANGEMENT AND METHOD OF MAKING

CROSS-REFERENCE TO RELATED APPLICATION

This application is based upon and claims the benefit of priority from Japanese Patent Application No. 2014-052181, filed Mar. 14, 2014, the entire contents of which are incorporated herein by reference.

FIELD

Embodiments described herein relate generally to a semiconductor device.

BACKGROUND

Semiconductor devices using nitride semiconductors or silicon carbide (SiC) as base materials are receiving attention. The reason is that these materials have band gaps that are larger than that of silicon, and thus may be used to achieve semiconductor devices with higher breakdown voltages than silicon based devices. However, although the breakdown voltage of the material is high, if the dielectric breakdown voltage of an electrode and surrounding dielectric structure provided on the corresponding material is low, it is impossible to take advantage of the material. For this reason, an electrode structure appropriate for a wide-band gap semiconductor is required.

DETAILED DESCRIPTION

Figure 1:
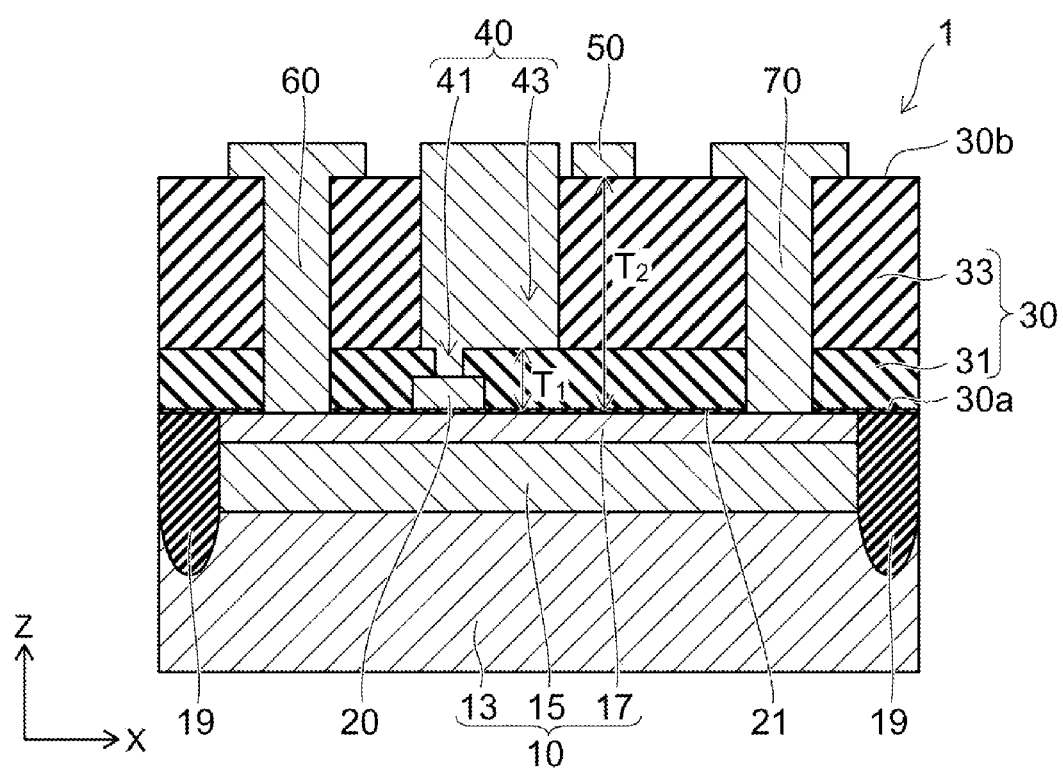
FIG. 1 is a cross-sectional view schematically illustrating a semiconductor device according to an embodiment.

Embodiments provide a semiconductor device having an electrode structure which has a high breakdown voltage and is easy to manufacture.

In general, according to one embodiment, a semiconductor device includes: a semiconductor layer; gate electrodes that are provided on the semiconductor layer; an insulating film that covers the semiconductor layer and the gate electrodes, and has a first surface positioned on the semiconductor layer side thereof and a second surface positioned on the opposite side to the first surface thereof; and source electrodes and drain electrodes that are provided in the insulating film. Each source electrode is provided at a position spaced from a corresponding gate electrode on the semiconductor layer, such that one end thereof is in contact with the semiconductor layer and the other end thereof is exposed at the second surface side of the insulating film. Each drain electrode is provided at a position spaced farther from a gate electrode corresponding thereto than the source electrode corresponding to that same gate electrode, in a direction from the source electrode toward the gate electrode, such that one end is in contact with the semiconductor layer and the other end is exposed. Further, the semiconductor device includes first field plate electrodes, each of which is provided on a corresponding gate electrode, and second field plate electrodes, each of which is provided on the insulating film so as to be positioned between a corresponding first field plate electrode and a corresponding drain electrode. Each first field plate electrode includes a first portion that is in contact with a corresponding drain electrode, and a second portion that is provided on the insulating film so as to be positioned between the first portion and a corresponding drain electrode. Further, the thickness of the insulating film between each first field plate electrode and the semiconductor layer is smaller than the thickness of the insulating film between each second field plate electrode and the semiconductor layer.

Hereinafter, an embodiment will be described with reference to the accompanying drawings. Identical features depicted in the drawing Figures are denoted by the same reference symbols and detailed descriptions thereof may be appropriately omitted, and different features in different drawing Figures will be described. Also, the drawings are schematic or conceptual, and the relation between the thickness and width of features depicted, the size ratio of features and the like are not necessarily the same as those in an actual device. Further, the same features may be shown with different dimensions or ratios depending on the drawings. In the following description, the location of each physical feature may be described using the X-axis direction, Y-axis direction, and Z-axis direction of an orthogonal coordinate system shown in the drawings. Also, the Z-axis direction may be referred to as an upper side, and the opposite direction to the Z-axis direction may be referred to as a lower side.

FIG. 1 is a cross-sectional view schematically illustrating a semiconductor device 1 according to an embodiment.

Figure 2:
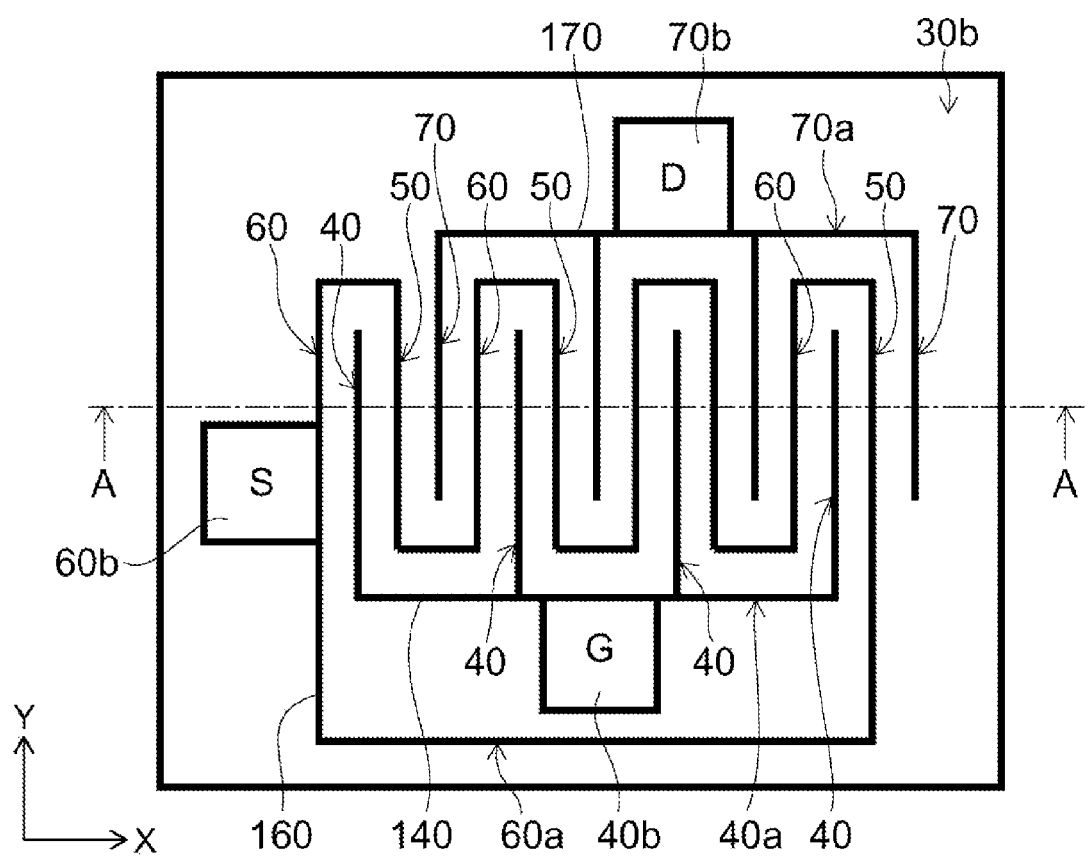
FIG. 2 is a plan view schematically illustrating the semiconductor device according to the embodiment.

FIG. 2 is a plan view schematically illustrating the semiconductor device 1 according to the embodiment.

FIG. 2 is a plan view schematically illustrating the top surface of the semiconductor device 1. FIG. 1 illustrates a unit cell of the semiconductor device 1 as a portion of a cross section taken along a line A-A shown in FIG. 2.

The semiconductor device 1 is, for example, an electric power control field effect transistor (FET) using a nitride semiconductor as a material.

The semiconductor device 1 includes a semiconductor layer 10, and gate electrodes 20, source electrodes 60, and drain electrodes 70 which are provided on the semiconductor layer 10. Further, the semiconductor device 1 includes an insulating film 30 which covers the semiconductor layer 10 and portions of the gate electrodes 20. Here, it will be understood that when an element is referred to as "covering" another element, it may be directly on the other element or may be on the other element with one or more other elements interposed therebetween.

The insulating film 30 has a first surface 30a which is located on the semiconductor layer (10) side thereof, and a second surface 30b which is positioned on the opposite side to the first surface 30a.

The source electrodes 60 are provided on the semiconductor layer 10 at positions spaced from the locations of the gate electrodes 20 on the semiconductor layer 10. Each source electrode 60 is provided in the insulating film 30 such that one end thereof is in contact with the semiconductor layer 10, and the other end thereof is exposed at or above the second surface (30b) side of the insulating film 30.

Each drain electrode 70 is provided in the insulating film 30 such that one end thereof is in contact with the semiconductor layer 10 and the other end thereof is exposed at or above the second surface (30b) side of the insulating film 30. The drain electrode 70 is spaced in the X direction along the surface of the semiconductor layer 10 and in the insulating film 30, to one side of the gate electrode 20 correspondingly functioning therewith, and the source electrode is spaced in the X direction along the surface of the semiconductor layer 10 and in the insulating film 30 from the other side of the gate electrode 20 correspondingly functioning therewith, and the distance (width of the insulating film 30) between the source electrode 60 and gate electrode 30 is less than the distance (width of the insulating film 30) between the drain electrode 70 and gate electrode 20.

The semiconductor device 1 further includes first field plate electrodes (hereinafter, referred to as the FP electrodes 40) which are provided on the gate electrodes 20 and extend therefrom through the insulating film 30, and second field plate electrodes (hereinafter, referred to as the FP electrodes 50) which are provided on the insulating film 30.

Each FP electrode 40 includes a first portion 41 which is in contact with a corresponding gate electrode 20, and a second portion 43 which is provided on the insulating film 30. The second portion 43 extends from the location of the gate electrode 20 in the direction of, but spaced from the drain electrode 70 by, the insulating film 30 and acts as a field plate. That is, each FP electrode 40 is a portion of a gate wiring for supplying a gate bias to a corresponding gate electrodes 20, and also act as a field plate.

Each FP electrode 50 is provided between a corresponding FP electrode 40 and a corresponding drain electrode 70, on the second surface 30b of the insulating film 30. Further, the thickness $T_1$ of the insulating film 30 between the second portion 43 of each FP electrode 40 and the semiconductor layer 10 is smaller than the thickness $T_2$ of the insulating film 30 between the FP electrode 50 and the semiconductor layer 10.

Subsequently, the structure of the semiconductor device 1 will be described in detail with reference to FIG. 1.

For example, the semiconductor layer 10 includes a first semiconductor layer 13, a second semiconductor layer 15 which is provided on the first semiconductor layer 13, and a third semiconductor layer 17 which is provided on the second semiconductor layer 15.

The first semiconductor layer 13 is, for example, a high-resistance or semi-insulating gallium nitride (GaN) layer. The first semiconductor layer 13 may be a p-type GaN layer.

The second semiconductor layer 15 is a so-called channel layer, and is, for example, an n-type GaN layer.

The third semiconductor layer 17 is a so-called barrier layer, and is, for example, an n-type AlGaN layer.

The semiconductor layer 10 includes insulating regions 19 for electrically isolating unit cells from one another. In each unit cell, insulating regions 19 are provided on the outer sides than the source electrode 60 and the drain electrode 70. The insulating regions 19 are provided, for example, with a depth which reaches from the top surface of the third semiconductor layer 17 into the first semiconductor layer 13, such that a trench comprised of the insulating region surrounds a source 60, a drain 70 and a gate 40 located therebetween.

In this example, a gate insulating film 21 is provided on the third semiconductor layer 17, and on the gate electrodes 20 are located on the gate insulating film 21. That is, the gate insulating film 21 is provided between the semiconductor layer 10 and the gate electrodes 20. As the gate insulating film 21 composition, for example, a silicon oxide film or a silicon nitride film may be used. Also, as the gate insulating film 21, for example, an aluminum nitride (AlN) film may be used.

As the gate electrode 20 material, for example, a conductive polycrystalline silicon film doped with dopants may be used. As will be described below, as a material for the gate electrodes 20, a material resistant to heat, for example, a material which withstands a heat treatment of 800° C. or more is preferable.

For example, the insulating film 30 includes a first layer 31 which covers the semiconductor layer 10 and partially covers the gate electrodes 20, and a second layer 33 which is provided over the first layer 31. Further, the second portions 43 of the FP electrodes 40 overlie a portion of the first layer 31, and the FP electrodes 50 are provided on the outer surface of the second layer 33.

The second layer 33 may be formed of the same material as that of the first layer 31, or may be formed of a material different from that of the first layer 31. Each of the first layer 31 and the second layer 33 may be formed of, for example, a silicon oxide film or a silicon nitride film.

In the semiconductor device 1, a current flows between a source and a drain through a depletion region induced at the interface of the second semiconductor layer 15 and the third semiconductor layer 17. Further, a current between a source and a drain is controlled by applying a gate bias to a corresponding gate electrode 20.

The FP electrodes 40 and the FP electrodes 50 control electric fields between gates and the drains, thereby controlling a variation in the characteristics of the semiconductor device 1. For example, the FP electrodes 40 and the FP electrodes 50 reduce the concentration of an electric field induced at the side of the gate electrode 20 positioned on the drain electrode (70) side thereof, thereby suppressing a characteristic variation attributable to surface charge between a gate and a drain, that is, a so-called collapse. In the present embodiment, since the two field plate electrodes 40 and 50 are disposed between each gate electrode 20 and a corresponding drain electrode 70, it is possible to more effectively suppress undesired electric fields between gates and drains.

Subsequently, a configuration of a gate wiring 140, a source wiring 160, and a drain wiring 170 which connect the plurality of unit cells of the semiconductor device 1 will be described with reference to FIG. 2. FIG. 2 schematically illustrates individual wirings provided on the second surface 30b of the insulating film 30. As illustrated in FIG. 2, each of the gate wiring 140 and the drain wiring 170 is provided in a comb, i.e., interleaved, form.

The gate wiring 140 includes the plurality of FP electrodes 40, a gate wiring portion 40a which electrically connects the plurality of FP electrodes 40 to one another, and a gate pad 40b which is connected to the gate wiring portion 40a. The FP electrodes 40 extend in the Y-axis direction, such that the gate electrodes 20 are located therebelow. For example, the gate wiring portion 40a and the gate pad 40b are provided on the second surface 30b of the insulating film 30.

The drain wiring 170 includes the plurality of drain electrodes 70, a drain wiring portion 70a which electrically connects the plurality of drain electrodes 70 to one another, and a drain pad 70b which is connected to the drain wiring portion 70a. The drain electrodes 70 also extend in the Y-axis direction, and are connected to the drain wiring portion 70a. For example, the drain wiring portion 70a and the drain pad 70b are provided on the second surface 30b of the insulating film 30.

The gate wiring 140 and the drain wiring 170 are provided such that the FP electrodes 40 and the drain electrodes 70 are alternately positioned and thus interleaved in the X-axis direction. The source wiring 160 is provided so as to weave (extend) between the FP electrodes 40 and the drain electrodes 70, and is disposed so as to surround the gate wiring 140 in the X-Y plane.

The source wiring 160 includes the source electrodes 60, the FP electrodes 50, a source wiring portion 60a, and a source pad 60b which is connected to the source wiring portion 60a. That is, the FP electrodes 50 are electrically connected to the source electrodes 60. Also, for example, the source wiring portion 60a and the source pad 60b are provided on the second surface 30b of the insulating film 30.

The embodiment is not limited to the above described example. For example, the FP electrodes 50 may be electrically connected to the gate electrodes 20 through the FP electrodes 40. Also, the FP electrodes 50 may be provided so as not to overlap the FP electrodes 40. For example, the individual wiring patterns illustrated in FIG. 2 do not intersect with one another, and thus they may be formed in on by deposition, lithography and etch sequence in a manufacturing process. Therefore, it is possible to simplify the manufacturing process, and thus it is possible to reduce the manufacturing cost.

Figure 3:
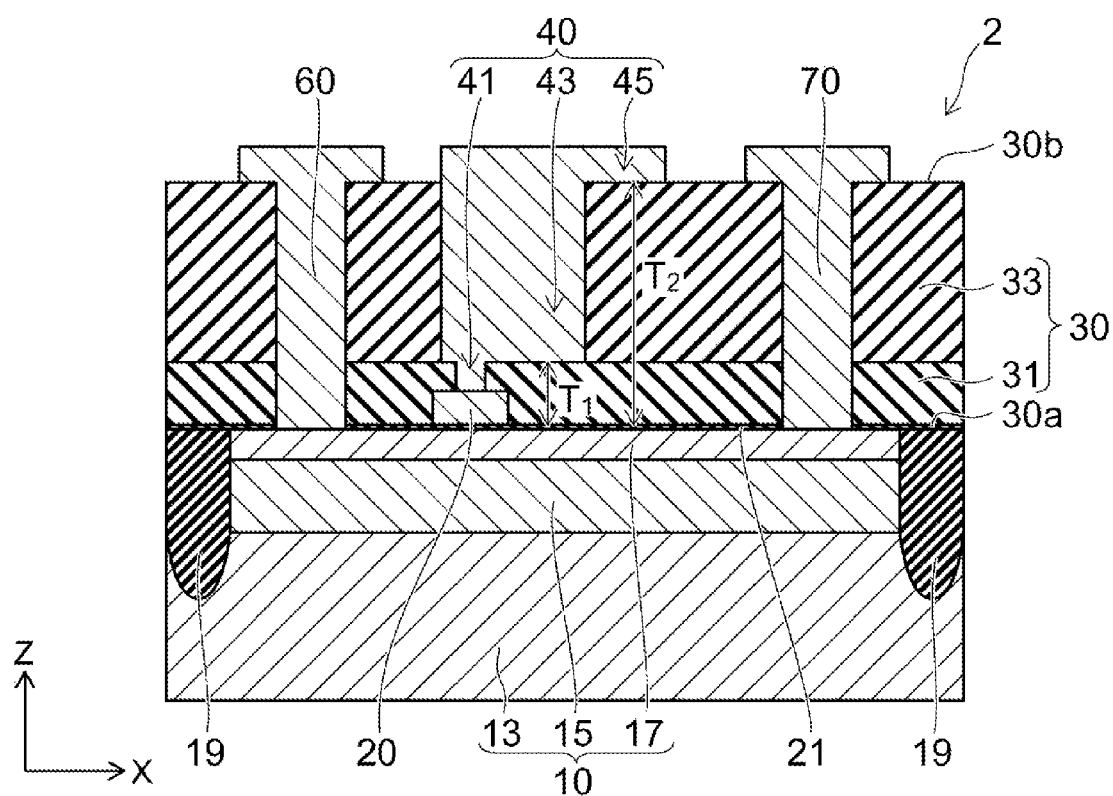
FIG. 3 is a cross-sectional view schematically illustrating a semiconductor device according to a modification of the embodiment.

FIG. 3 is a cross-sectional view schematically illustrating a semiconductor device 2 according to a modification of the embodiment. The semiconductor device 2 is also, for example, an electric power control FET using a nitride semiconductor as a material.

As illustrated in FIG. 3, in the semiconductor device 2, each FP electrode 40 and a corresponding FP electrode 50 are integrated into a single structure. That is, each FP electrode 40 includes a third portion 45 which extends over the upper surface of the insulating film 40 and acts as a second field plate electrode.

Each FP electrode 40 includes a first portion 41 which is in contact with a corresponding gate electrode 20, a second portion 43 which acts as a first field plate, and a third portion 45 which acts as a second field plate. The distance $T_1$ between each second portion 43 and the semiconductor layer 10 is shorter than the distance $T_2$ between each third portion 45 and the semiconductor layer 10.

Again in this example, an insulating film 30 includes a first layer 31 and a second layer 33. Further, the second portions 43 are provided on the first layer 31, and the third portions 45 are provided on the second layer 33.

As in the semiconductor device 1, in the semiconductor device 2, the second portions 43 and the third portions 45 control electric fields between gates and drains, thereby suppressing a characteristic variation. Since the distance $T_2$ between each third portion 45 and the semiconductor layer 10 is longer than the distance $T_1$ between each second portion 43 and the semiconductor layer 10, it is possible to gradually alleviate concentration of an electric field on an end of the gate electrode 20 positioned on the drain side. Therefore, it is possible to effectively suppress a so-called collapse, for example, a variation in current flowing between a gate and a drain.

Subsequently, a method of manufacturing the semiconductor device 1 will be described with reference to FIGS. 4A to 6.

FIGS. 4A to 6 are cross-sectional views schematically illustrating processes of manufacturing the semiconductor device 1 according to the embodiment. In these drawings, the semiconductor layer 10 is not illustrated.

Figure 4A:
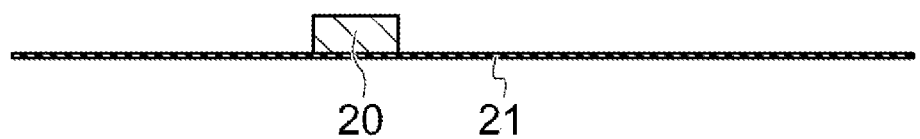
FIGS. 4A to 4C are cross-sectional views schematically illustrating processes of manufacturing the semiconductor device according to the embodiment, respectively.

As illustrated in FIG. 4A, the gate insulating film 21 is formed on a wafer including the semiconductor layer 10. Thereafter, on the gate insulating film 21, the gate electrodes 20 are formed.

The gate insulating film 21 is, for example, a silicon oxide film, and may be formed by an atomic layer deposition (ALD) method.

The gate electrodes 20 are formed of, for example, polycrystalline silicon doped with dopants. For example, on the gate insulating film 21, a polycrystalline silicon layer is formed by a chemical vapor deposition (CVD) method. Subsequently, an etch mask is formed on the polycrystalline silicon layer by photolithography. Thereafter, the polycrystalline silicon layer is selectively etched, for example, by a RIE method, whereby the gate electrodes 20 are formed.

Figure 4B:
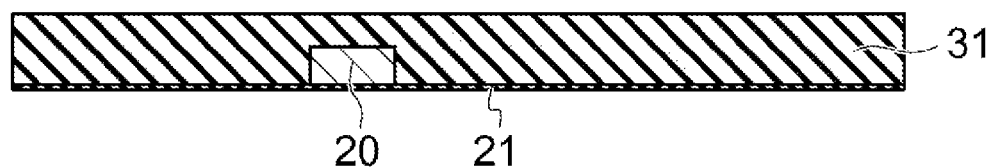
Figure 4C:
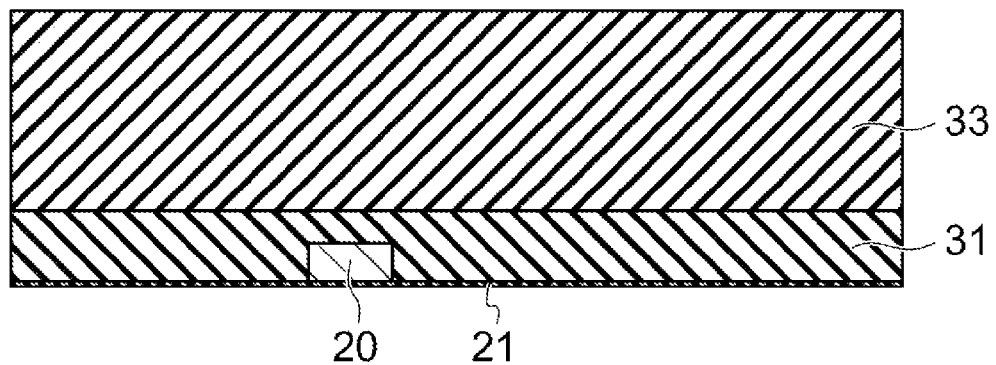

Next, as illustrated in FIG. 4B, the first layer 31 of the insulating film 30 is formed so as to cover the gate insulating film 21 and the gate electrodes 20. The first layer 31 is, for example, a silicon nitride film, and is formed by a plasma CVD method.

Subsequently, on the first layer 31, the second layer 33 is formed as illustrated in FIG. 4B. The second layer 33 is, for example, a silicon oxide film, and may be formed by a TEOS-CVD method.

Next, the gate insulating film 21, the first layer 31, and the second layer 33 are thermally treated, whereby film qualities thereof are improved. For example, after the insulating film 30 including the first layer 31 and the second layer 33 is formed, the wafer is put in a heat-treating furnace and is heated for a predetermined time. The temperature of the heat treatment is, for example, 800° C. Therefore, it is possible to bond dangling bonds in the insulating film 30 and the gate insulating film 21. For example, hydrogen atoms are eliminated from dangling bonds that are present in the films and terminated by hydrogen atoms, and the dangling bonds are bonded to other dangling bonds. Therefore, the structure of the insulating film 30 is improved in density, and it is possible to improve, for example, the dielectric voltage.

Figure 5A:
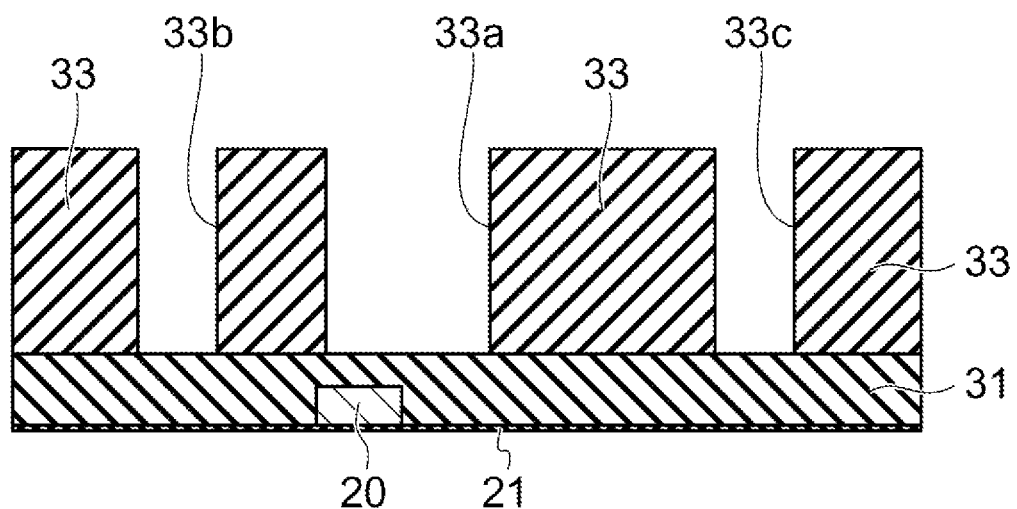
FIGS. 5A and 5B are cross-sectional views schematically illustrating the manufacturing processes subsequent to those of FIGS. 4A to 4C, respectively.

Next, in the first layer 31, openings 33a, 33b, and 33c are formed as illustrated in FIG. 5A. The openings 33a are formed at positions where the FP electrodes 40 will be formed. The openings 33b are formed at positions where the source electrodes 60 will be formed. The openings 33c are formed at positions where the drain electrodes 70 will be formed.

For example, the openings 33a, 33b, and 33c are formed using a selective RIE method. That is, it is preferable to use a condition for etching the second layer 33 without etching the first layer 31. In this case, it is possible to easily form the openings 33.

Figure 5B:
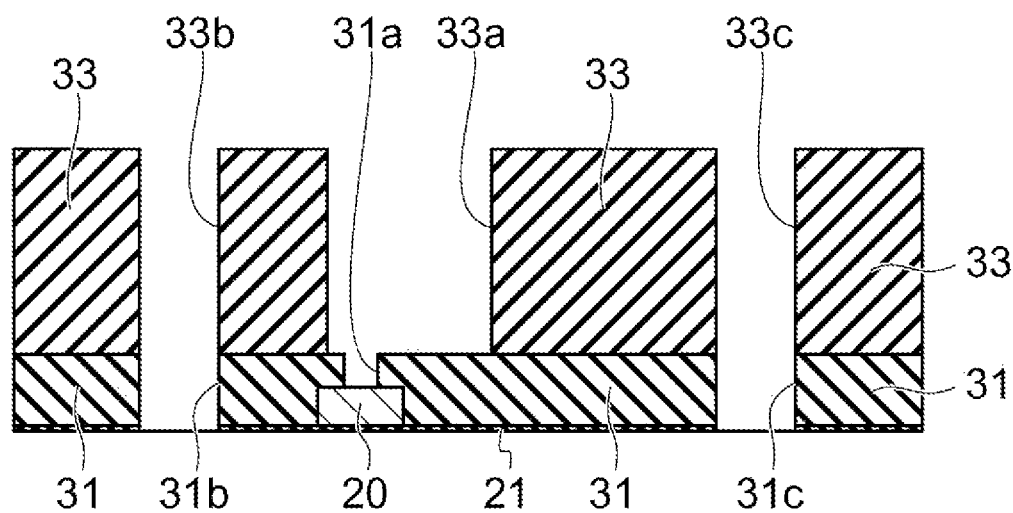

Next, the first layer 31 exposed at the bottoms of the openings 33 is selectively etched as illustrated in FIG. 5B. In the portions of the first layer 31 exposed at the bottoms of the openings 33a, openings 31a are selectively formed to extend to the gate electrodes 20. Also, the first layer 31 exposed at the bottoms of the openings 33b and the openings 33c is etched, whereby openings 31b and 31c are formed to extend to the semiconductor layer 10.

Figure 6:
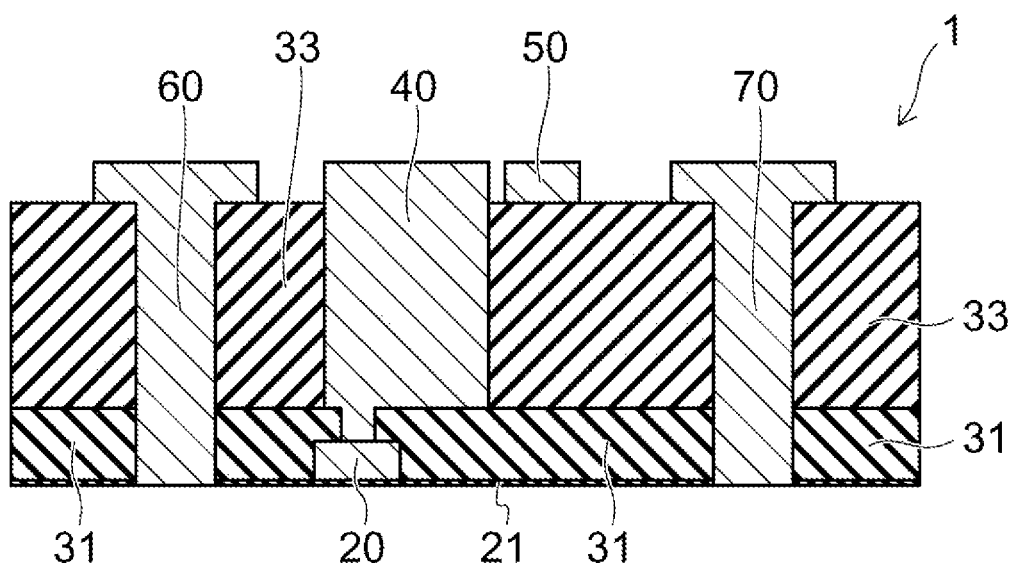
FIG. 6 is a cross-sectional view schematically illustrating the manufacturing process subsequent to that of FIG. 5B.

Next, as illustrated in FIG. 6, within the openings 31a and 33a, the FP electrodes 40 are formed, and within the openings 31b and 33b, the source electrodes 60 are formed, and within the openings 31c and 33c, the drain electrodes 70 are formed, and on the second layer 33, the FP electrodes 50 are formed. As a result, the semiconductor device 1 is completed.

For example, a conductive film may be formed by depositing a titanium nitride (TiN) film to cover the inner surfaces of the openings 31a to 31c, the inner surfaces of the openings 33a to 33c, and the second surface 30b of the insulating film 30, and forming a tungsten (W) film on the TiN film, and then selectively etching the tungsten film overlying the insulating film 30 into the individual electrodes. For example, if the wiring pattern of the semiconductor device 1 are as illustrated in FIG. 2, the individual electrodes may be formed simultaneously by photolithographic patterning of the tungsten layer followed by etching thereof.

As described above, the semiconductor device 1 according to the present embodiment may be manufactured by a simple manufacturing process, and it is possible to reduce the manufacturing cost thereof. Also, since a material resistant to heat, here doped polysilicon, is used for the gate electrodes 20, it is possible to perform heat treatment after forming the insulating film 30. Therefore, it is possible to improve the insulating film 30 density, and to improve the dielectric breakdown strength of the insulating film 30 after the gate electrodes are formed.

For example, a method of forming the first layer 31, forming the first field plate electrodes thereon, and forming the second layer 33 thereon may also be considered. However, according to this method, the insulating film 30 contains the first field plate electrodes therein. For this reason, in a case of using a metal where the first field plate electrodes are a metal such as tungsten, the temperature of a heat treatment on the insulating film 30 is restricted to a lower temperature. That is, in order to suppress thermal stresses attributable to deterioration of the metal or a difference in coefficient of thermal expansion between the metal and the insulating film 30 during the raising and lowering of the device to and from the annealing temperature, it is necessary to lower the temperature of the heat treatment. Also, a method of using polycrystalline silicon for the first field plate electrodes, and annealing after forming the field plate electrodes, may also be employed. However, since polycrystalline silicon has electrical conductivity lower than that of metals, the gate resistance is resultantly increased.

In contrast, in the present embodiment, because the insulating film. 30 is thermally treated at a high temperature, it is possible to improve the quality of the insulating film 30, and to increase the dielectric breakdown strength thereof, and thus the dielectric breakdown voltage of the device. Also, as it is possible to use metal for the FP electrodes 40, the resulting gate resistance is lowered.

As described above, the semiconductor device 1 includes the insulating film 30 having improved quality, and the first and second field plate electrodes 40 and 50 formed on the insulating film 30. Therefore, it is possible to improve the characteristics and reliability of the semiconductor device 1.

The insulating film 30 is not limited to the above described two-layer structure, and may be, for example, a single layer film. Also, the semiconductor layer 10 is not limited to a nitride semiconductor, and may use any other wide-gap semiconductor such as SiC.

Also, in this disclosure, the term "nitride semiconductor" includes group III-V compound semiconductors of $B_xIn_yAl_zGa_{1-x-y-z}N$ (wherein $0 \leq x \leq 1$, $0 \leq y \leq 1$, $0 \leq z \leq 1$, and $0 \leq x+y+z \leq 1$), and also includes mixed crystal containing nitrogen (N), phosphorous (P), arsenic (As), or the like as a group V element. Further, the term "nitride semiconductor" includes group III-V compound semiconductors or mixed crystal further containing a variety of added elements for controlling a variety of physical properties such as a conductivity type, and group III-V compound semiconductors or mixed crystal further containing a variety of unintended elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of making a semiconductor device, comprising:

providing a substrate;

forming a gate insulating layer on a surface of the substrate;

forming a plurality of gate electrodes on the gate insulating layer;

forming, by chemical vapor deposition, an insulating film overlying the gate electrodes and gate insulating layer;

annealing the substrate having the gate electrodes and gate insulating layer film formed thereon at a temperature sufficient to increase the dielectric breakdown strength thereof;

etching source electrode openings, drain electrode openings, and field plate electrode openings partially inwardly of the insulating layer, the field plate electrode opening overlying the gate electrode and extending therefrom in the direction of the drain electrode openings;

etching the source and the drain electrode openings through a remaining insulating film thickness and the gate insulating layer to the substrate, while simultaneously etching only that portion of the remaining insulating film thickness in the field plate electrode opening at a location which overlies the gate electrode through the remaining insulating film to the gate electrode;

simultaneously depositing metal into the source, drain, and field plate electrode openings, and over a surface of the remaining insulating film to form a metal layer; and pattern etching the metal layer overlying the remaining insulating film to isolate source electrodes in the source electrode openings, first field plate electrodes in the field plate electrode openings and drain electrodes in the drain electrode openings from one another.

2. The method of claim 1, further comprising:

during the pattern etching of the metal layer overlying the remaining insulating film, simultaneously pattern etching the metal layer film to form second field plate electrodes on the surface of the remaining insulating film between the drain electrodes and the first field plate electrodes.

3. The method of claim 1, further comprising:

during the pattern etching of the metal layer overlying the remaining insulating film, simultaneously pattern etching the metal layer film to provide an interconnect on the outer surface of the gate insulating layer to interconnect the source electrodes with one another.

4. The method of claim 3, further comprising:

during the pattern etching of the metal layer overlying the remaining insulating film, simultaneously pattern etching the metal layer film to provide an interconnect on the outer surface of the gate insulating layer to interconnect the drain electrodes with one another.

5. The method of claim 4, further comprising:

during the pattern etching of the metal layer overlying the remaining insulating film, simultaneously pattern etching the metal layer film to provide an interconnect on the outer surface of the gate insulating layer to interconnect the first field plate electrodes with one another.

6. The method of claim 5, wherein the interconnection of the first field plate electrodes, the interconnection of the source electrodes, and the interconnection of the drain electrodes are all isolated from one another.

7. The method of claim 6, wherein the source and drain electrodes extend parallel and are interleaved with respect to one another, and the first field plate electrodes and an interconnection of second field plate electrodes forms a continuous metal structure which is interwoven between the source and drain electrodes.

\* \* \* \* \*